(12) United States Patent
Kim

(10) Patent No.: US 7,985,613 B2
(45) Date of Patent: Jul. 26, 2011

(54) METHOD FOR MANUFACTURING BACK SIDE ILLUMINATION IMAGE SENSOR

(75) Inventor: Mun Hwan Kim, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 40 days.

(21) Appl. No.: 12/641,391

(22) Filed: Dec. 18, 2009

(65) Prior Publication Data

US 2010/0167452 A1    Jul. 1, 2010

(30) Foreign Application Priority Data

Dec. 26, 2008 (KR) .................. 10-2008-0134608

(51) Int. Cl.
*H01L 21/00* (2006.01)

(52) U.S. Cl. .............. 438/65; 438/59; 438/70; 438/455; 438/458; 257/E21.001

(58) Field of Classification Search .................. 438/59, 438/65, 70, 455, 458; 257/E21.001
See application file for complete search history.

(56) References Cited

U.S. PATENT DOCUMENTS

| | | | |
|---|---|---|---|
| 6,191,007 B1* | 2/2001 | Matsui et al. | 438/459 |
| 7,582,502 B1* | 9/2009 | Hwang et al. | 438/59 |
| 2005/0104148 A1* | 5/2005 | Yamamoto et al. | 257/432 |
| 2006/0006488 A1* | 1/2006 | Kanbe | 257/443 |
| 2009/0057803 A1* | 3/2009 | Kanbe | 257/443 |
| 2009/0189234 A1* | 7/2009 | Mabuchi | 257/432 |
| 2009/0197365 A1* | 8/2009 | Kim et al. | 438/70 |
| 2010/0159632 A1* | 6/2010 | Rhodes et al. | 438/73 |

* cited by examiner

*Primary Examiner* — Angel Roman
(74) *Attorney, Agent, or Firm* — Saliwanchik, Lloyed & Eisenschenk

(57) ABSTRACT

A method of manufacturing a back side illumination image sensor is provided. The method can include forming an ion implantation layer in a front side of a first substrate, forming a photodetector and a readout circuit on the first substrate, forming an interlayer dielectric layer and a metal line on the front side of the first substrate, bonding a second substrate with the front side of the first substrate, removing a lower portion of the first substrate on the basis of the ion implantation layer, performing an annealing process with respect on a back side of the first substrate, and forming a microlens over the photodetector.

18 Claims, 7 Drawing Sheets

METHOD FOR MANUFACTURING BACK SIDE ILLUMINATION IMAGE SENSOR

CROSS-REFERENCE TO RELATED APPLICATION

This application claims the benefit under 35 U.S.C. §119 of Korean Patent Application No. 10-2008-0134608, filed Dec. 26, 2008, which is hereby incorporated by reference in its entirety.

BACKGROUND

An image sensor is a semiconductor device that converts an optical image into an electrical signal. Image sensors are typically classified as charge coupled devices (CCD) or Complimentary Metal Oxide Semiconductor (CMOS) image sensors (CIS).

According to the related art, photodiodes are formed on a substrate through an ion implantation scheme. However, as photodiodes become smaller to increase the number of pixels without enlarging the chip size, an area of a light receiving section is scaled down, thereby leading to degradation of the image quality.

In addition, since the stack height is not sufficiently reduced corresponding to the area reduction of the light receiving section, the number of photons input into the light receiving section can be decreased due to the diffraction of light, often referred to as "Airy Disk".

A back side illumination image sensor can be provided, which receives light through a wafer back side to minimize step difference at an upper portion of a light receiving section and removes light interference caused by metal routing.

FIG. 1 is a cross-sectional view showing the procedure for forming a back side illumination image sensor according to the related art.

A light receiving device and metal lines are formed on a front side of a substrate and then the substrate is subject to a back grinding process such that a predetermined portion of the back side of the substrate can be removed. That is, the back side of the substrate is ground by a predetermined thickness in order to adjust the distance between an external module and an optical lens.

However, according to the back side illumination image sensor of the related art, a silicon on insulator (SOI) wafer is used as a donor wafer having a light receiving device and a circuit section, and then the SOI wafer is bonded to a handle wafer. Then, a back side thinning process is performed with respect to the donor wafer.

In the back side thinning process for the donor wafer according to the related art, a back side grinding process is performed with respect to the donor wafer such that a silicon layer having thickness of several tens of tm may remain on a buried oxide (BOX) layer. Then, an etch back process is performed, thereby completing the back side thinning process.

However, according to the related art, the expensive SOI wafer is used as the donor wafer, leading to a high manufacturing cost.

In addition, referring to FIG. 1, wafer edge thinning may occur when the back side grinding process is performed with respect to the donor wafer. Thus, when the subsequent etch back process is performed, chip failure may occur at a wafer edge part, thereby significantly lowering the economical efficiency.

Furthermore, a wafer center part is exposed to plasma damage when the etch back process is performed with respect to the wafer having a thickness of several tens of μm, thereby degrading sensor performance.

In addition, a removing process must be performed with respect to a photodiode area of a back side of a silicon substrate. This leads to the generation of many defects on the surface of the silicon substrate through the process of removing the back side of the silicon substrate. Accordingly, a leakage characteristic is degraded, so that CIS image characteristics may be degraded.

Moreover, the photodiode is deposited by using amorphous silicon (Si). Otherwise, after a readout circuitry is formed on a silicon substrate and the photodiode is formed on another wafer, the photodiode is formed over the readout circuitry through a wafer-to-wafer bonding scheme to form an image sensor (hereinafter, referred to as a "3D image sensor"). In this case, the photodiode is connected with the readout circuitry through a metal line.

However, according to the related art method for manufacturing the 3D image sensor, the wafer-to-wafer bonding must be performed with respect to the wafer having the readout circuitry and the wafer having the photodiode. Due to the wafer-to-wafer bonding, electric connection between the readout circuitry and the photodiode may not be ensured. For instance, according to the related art, the metal line is formed on the readout circuitry and then the wafer-to-wafer bonding is performed to allow the metal line to make contact with the photodiode. At this time, the metal line may not firmly come into contact with the photodiode, and there is difficulty in formation of an ohmic contact between the metal line and the photodiode. In addition, a short may occur in the metal line electrically connected to the photodiode. Though much research and many studies have been conducted to prevent such a short from occurring, there is a need in the art for an improved method of manufacturing a back side illumination image sensor.

BRIEF SUMMARY

Embodiments of the present invention provide a method of manufacturing a back side illumination image sensor, capable of stably and efficiently removing a back side of a substrate in the image sensor.

Embodiments of the present invention also provide a method of manufacturing a back side illumination image sensor, capable of improving image quality by effectively removing defects existing on the surface of a substrate caused when an image sensor is manufactured.

The subject invention provides a method of manufacturing a back side illumination image sensor capable of significantly reducing the manufacturing cost.

Embodiments provide a method of manufacturing a back side illumination image sensor capable of significantly increasing the quantity of incident light by minimizing a stack on a light receiving section while forming a photodetector and a readout circuitry on the same substrate and inhibiting light interference and light reflection caused by metal routing.

According to an embodiment of the present invention, a method of manufacturing a back side illumination image sensor can include: forming an ion implantation layer in a front side of a first substrate; forming an isolation area on the front side of the first substrate to define a pixel area; forming a photodetector and a readout circuit in the pixel area; forming an interlayer dielectric layer and a metal line on the front side of the first substrate; bonding a second substrate with the front side of the first substrate having the metal line; removing a lower portion of the first substrate on a basis of the ion implantation layer; performing an annealing process on a back side of the first substrate, wherein the back side of the first substrate is opposite from the front side; and forming a microlens over the photodetector on the back side of the first substrate.

According to another embodiment, a method of manufacturing a back side illumination image sensor can include: forming an ion implantation layer in a front side of a first substrate; forming a photodetector and a readout circuit on the front side of the first substrate; forming an interlayer dielectric layer and a metal line on the front side of the first substrate; bonding a second substrate to the front side of the first substrate; removing a lower portion of the first substrate on a basis of the ion implantation layer; performing an annealing process on a back side of the first substrate, wherein the back side of the first substrate is opposite from the front side; and forming a micro-lens on the photo detector of the back side of the first substrate.

DETAILED DESCRIPTION

Hereinafter, a back side illumination image sensor and a method of manufacturing the same according to embodiments of the present invention will be described with reference to the accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Figure 1:
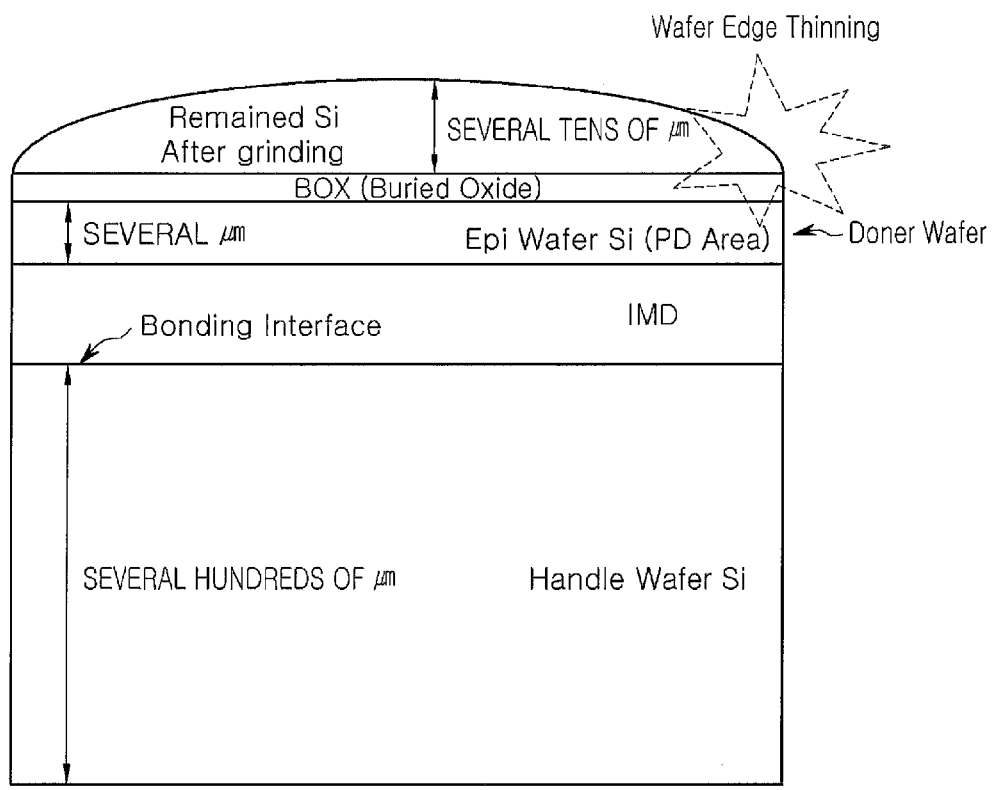
FIG. 1 is a cross-sectional view showing a manufacturing process of a back side illumination image sensor according to the related art.
Figure 2A:
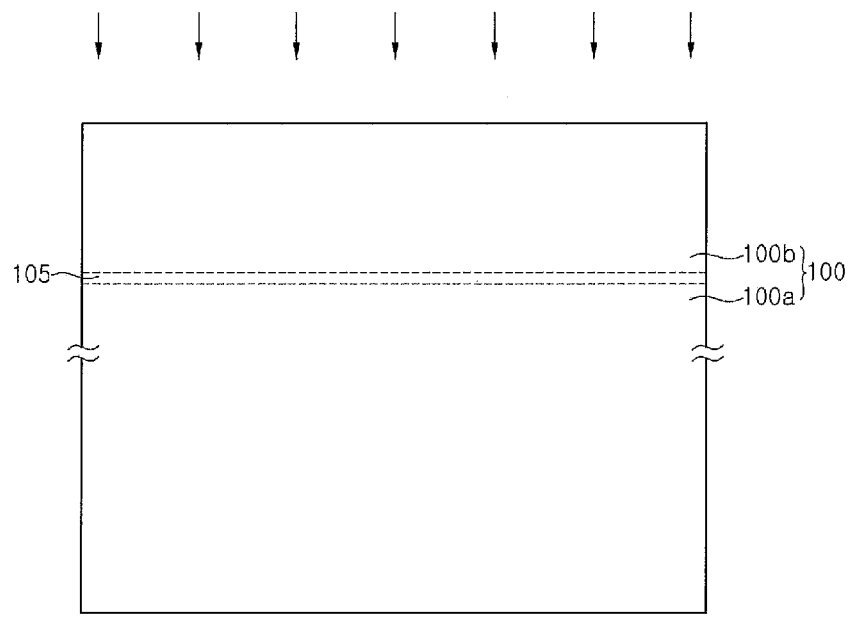
FIGS. 2 to 7 are cross-sectional views showing a method of manufacturing a back side illumination image sensor according to an embodiment of the present invention.
Figure 2B:
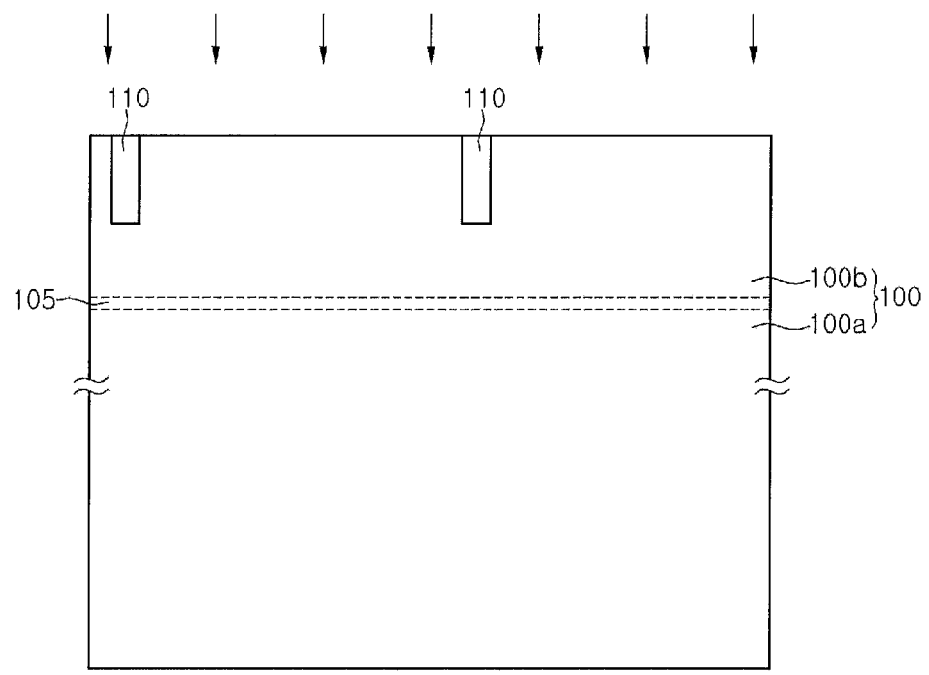
Figure 2C:
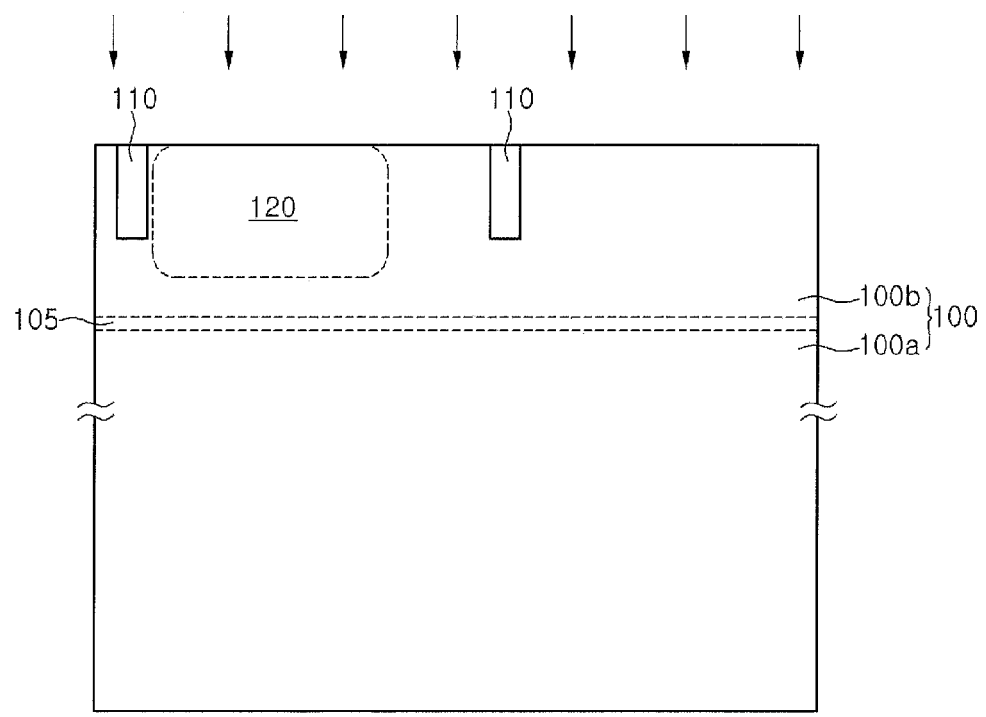

FIGS. 2A to 2C are cross-sectional views showing a process of forming an ion implantation layer 105.

Referring to FIG. 2A, the ion implantation layer 105 can be formed on a front side of a first substrate 100. The first substrate 100 can be, for example, an epitaxial wafer, though embodiments are not limited thereto. The ion implantation layer 105 can be partitioned into a lower 100a and an upper portion 100b on the basis of the ion implantation layer 105.

According to embodiments of the present invention, an epitaxial wafer can be used as a donor wafer. By using the epitaxial wafer, the manufacturing cost can be significantly reduced as compared with the use of an SOI wafer.

Also, a photodetector can be formed on the epitaxial wafer together with a circuit section. Accordingly, the manufacturing process can be simplified without a bonding process of a 3-D image sensor to form a photodiode over a circuit, thereby reducing the occurrence of potential problems in bonding and contact.

The ion implantation layer 105 can be formed by implanting ions onto the front side of the first substrate 100. Since a back side of the first substrate 100 can have a thickness on the order of, for example, about several hundreds of μm, the ion implantation process is preferably performed with respect to the front side of the first substrate 100.

In other words, since the first substrate 100 is very thick compared to the ion implantation depth, ion implantation for the back side of the first substrate 100 can be difficult. Therefore, the ion implantation layer 105 can be formed before a process of forming a metal line 140 or a bonding process with a second substrate 200 can be performed, so that the lower portion 100a of the first substrate 100 can be easily removed after the bonding process has been performed.

The ion implantation layer 105 can be formed by implanting, for example, hydrogen ions or helium ions, though embodiments are not limited thereto.

Referring to FIG. 2B, an isolation area 110 can be formed on the front side of the first substrate 100. The isolation area 110 can be formed before or after the ion implantation layer 105. The isolation area 110 can be formed, for example, on the front side of the first substrate 100 to define a pixel area. Then, in an embodiment, the ion implantation layer 105 can be formed thereafter. The isolation area 110 can be formed, for example, through a shallow trench isolation (STI) process, though embodiments are not limited thereto.

Accordingly, the back side of a substrate may not be removed through a grinding process, but easily and stably removed by using the ion implantation layer 105. Thus, the product yield of the back side illumination image sensor can be significantly raised.

The ion implantation process can be performed by using hydrogen or helium ions to form the ion implantation layer 105 serving as a cleaving layer while the manufacturing process is being performed using the epitaxial wafer. Then, the first substrate 100 serving as the donor wafer can be bonded to the second substrate 200 (see, e.g., FIG. 4) serving as the handle wafer after the process for the first substrate 100 has been completed. Since the remaining first substrate 100 serving as a donor wafer can be thin because the lower portion of the first substrate 100 can be removed, the second substrate 200 serving as a handle wafer may be required in order to facilitate a color filter process after the bonding process has been performed. The cleaving process can be performed with respect to the first substrate 100 for the purpose of backside thinning.

According to embodiments of the present invention, since the ion implantation process and the cleaving process can be employed, a back grinding process and an etch-back process may not be required. Accordingly, problems such as edge die fall and plasma damage, which are common in the related art, may not occur.

Also, since the grinding process may not be performed with respect to the donor wafer, physical stress may not be applied to the donor wafer. Accordingly, the photodetector and the readout circuit can be inhibited from being damaged.

Referring to FIG. 2C, a photodetector 120 can be formed in the pixel area, before or after forming the ion implantation layer 105. The photodetector 120 can include, for example, a photodiode, though embodiments are not limited thereto. In an embodiment, the photodetector 120 can be formed by forming an N-type ion implantation area on the P-type first substrate 100 and then forming a $P_o$ area (not shown) on the N-type ion implantation area of the first substrate 100. Extra electrons can be blocked by the $P_o$ area. In addition, a PNP junction can be formed such that a charge dumping effect can be obtained.

Figure 3:
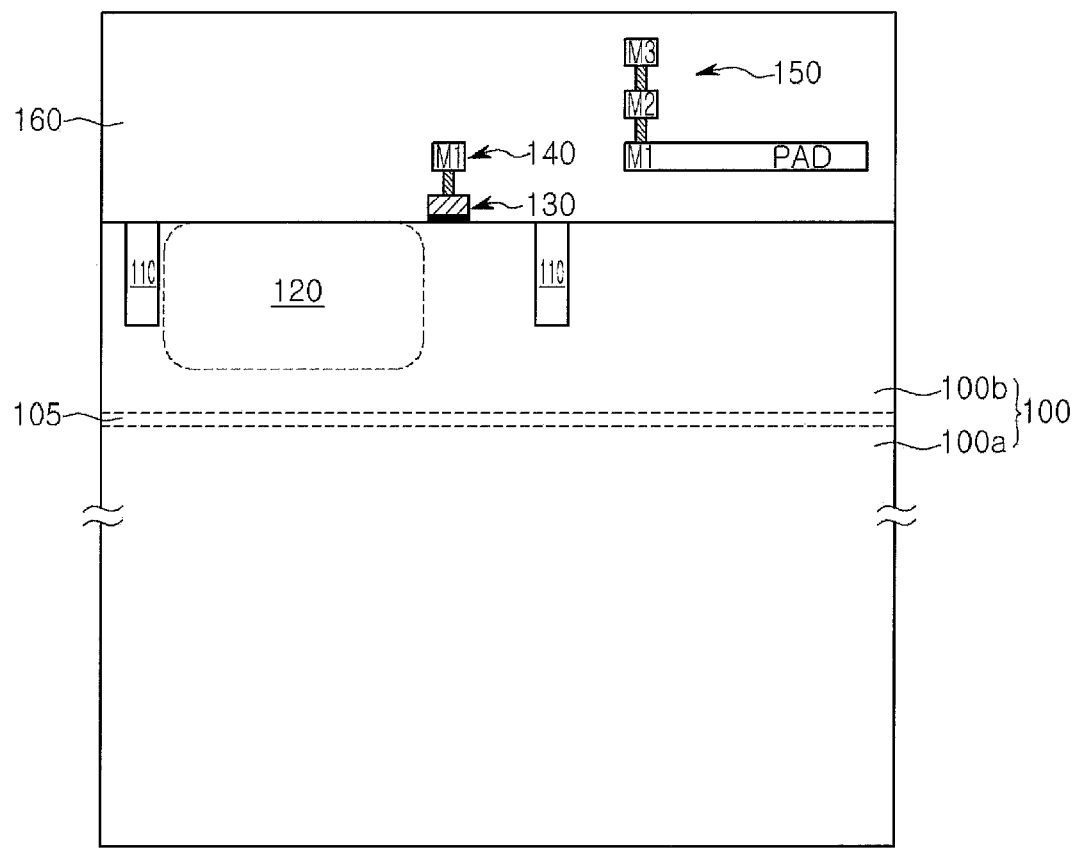

Referring to FIG. 3, a readout circuit 130, that can be a circuit section, can be formed on the first substrate 100 having the photodetector 120. The readout circuit 130 can include a transfer transistor, a reset transistor, a drive transistor, and a select transistor, though embodiments are not limited thereto.

According to the present invention, an epitaxial wafer can be used as the first substrate 100 serving as the donor wafer, and the photodetector 120 can be formed on the first substrate 100 together with the readout circuit 130. Accordingly, since a bonding process may not be required in a 3D image sensor in which the photodetector 120 is formed over a circuit, the manufacturing process can be simplified, and problems related to bonding and contact may not occur. Also, when the handle wafer is bonded with the donor wafer, an interlayer dielectric layer can be interposed between the handle wafer and the donor wafer, so that problems related to bonding may not occur.

According to embodiments, the stack on the photodetector can be minimized, thereby maximizing (or at least significantly increasing) the amount of incident light. In addition, light interference and reflection caused by a metal routing can be inhibited, so that the optical characteristic of the image sensor can be improved.

An interlayer dielectric layer 160 can be formed on the first substrate 100, and a metal line 140 can be formed in the interlayer dielectric layer 160. The metal line 140 can include a first metal M1.

A pad line 150 can be formed in a logic area. The pad line 150 can include, for example, a first metal M1, a second metal M2, and a third metal M3, though embodiments are not limited thereto. The first metal M1 for the pad line 150 can be the same as the first metal M1 for the metal line M1, though that is not necessarily the case. In an embodiment, a PAD can be aligned in line with the first metal M1 of the pad line 150. Accordingly, after the bonding process with the second substrate 200 has been performed, a pad open process can be easily performed with respect to the back side of the first substrate 100. This is because a low depth can be present from the back side of the first substrate 100 to the PAD.

Figure 4:
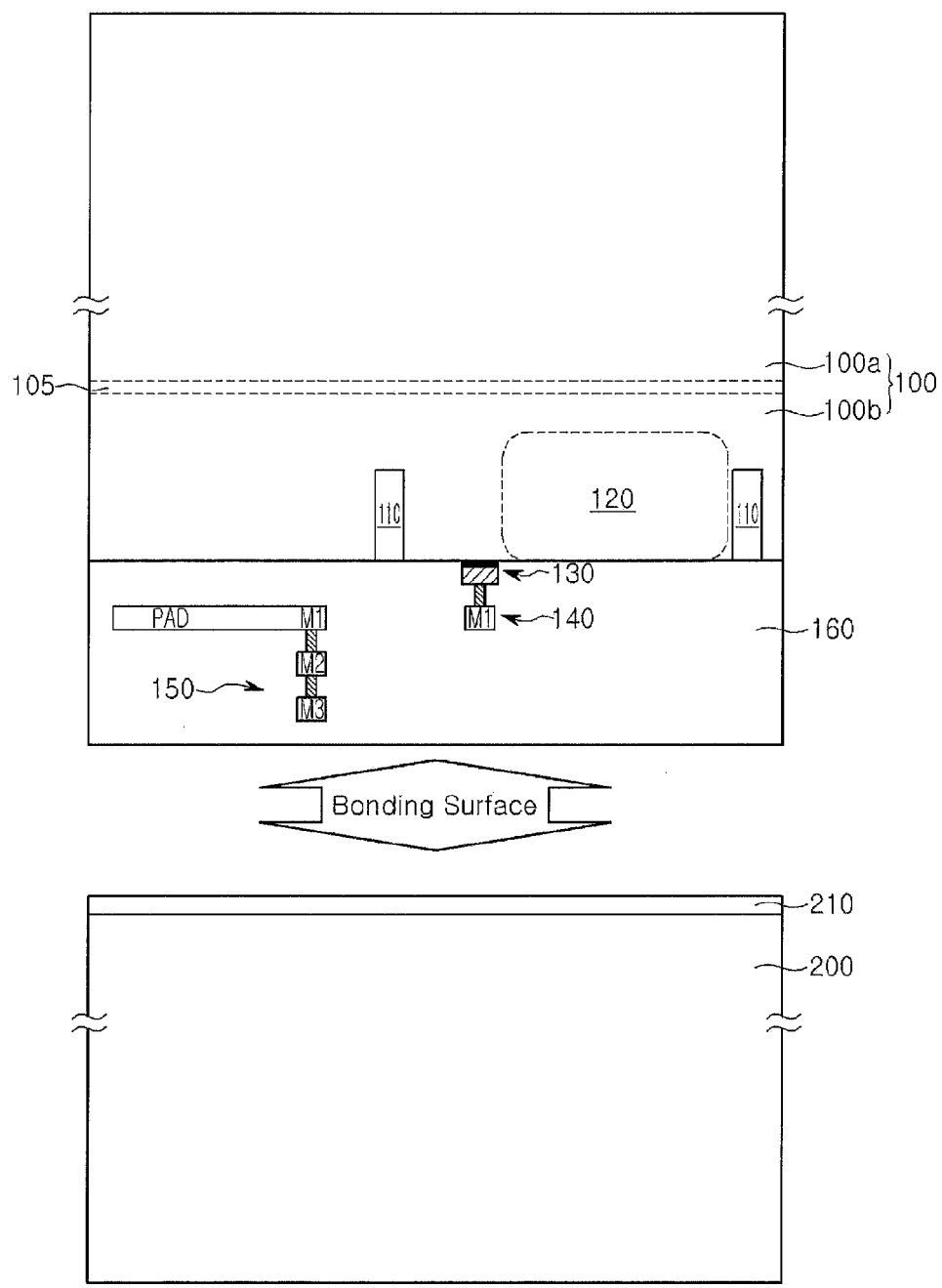

Referring to FIG. 4, the second substrate 200 can be bonded to the front side of the first substrate 100 having the metal line 140. For example, the second substrate 200 serving as a handle wafer can be bonded with the first substrate 100 such that the second substrate 200 corresponds to the side of the metal line 140 of the first substrate 100.

In an embodiment, an insulating layer 210 can be formed on a top surface of the second substrate 200 before bonding with the first substrate 100, thereby increasing adhesion strength with the first substrate 100 during the bonding process. The insulating layer 210 can include, for example, an oxide layer or a nitride layer, though embodiments are not limited thereto. The insulating layer 210 can make contact with the interlayer dielectric layer 160 on the front side of the first substrate 100 during the bonding process, so that the adhesion strength between the first and second substrates 100 and 200 can be significantly increased.

Figure 5:
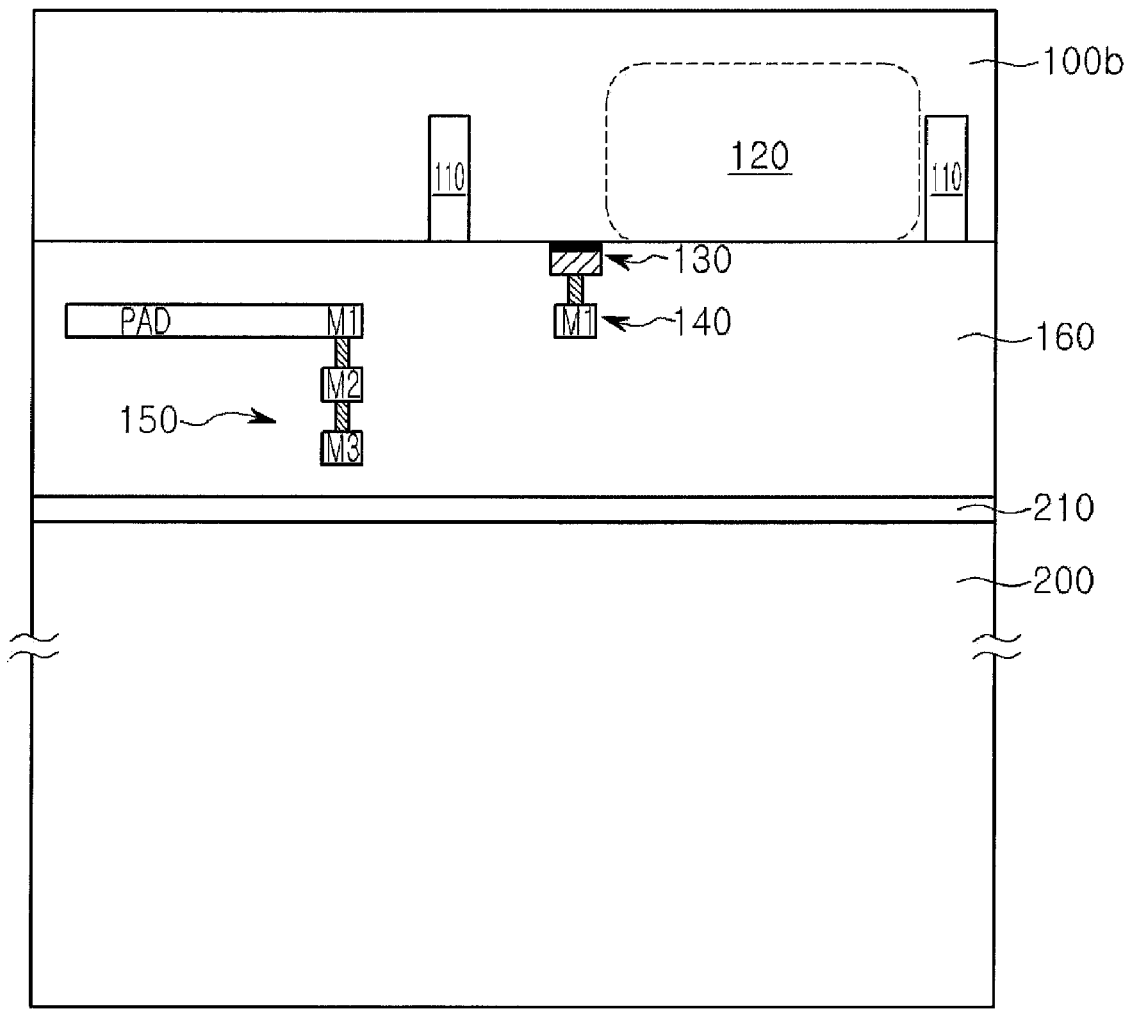

Referring to FIG. 5, the lower portion 100a of the first substrate 100 can be removed on the basis of the ion implantation layer 105. For example, a heat treatment can be performed with respect to the ion implantation layer 105, thereby bubbling hydrogen ions. In an embodiment, the lower portion 100a of the first substrate can be cut away by using a blade, so that the upper portion 100b of the first substrate 100 remains. Thereafter, a planarization process can be performed with respect to the surface of the first substrate 100.

In related art 3D image sensors, a photodetector and readout circuitry may be formed on their own wafers, and then the bonding and interconnection processes are performed. However, according to the 3D image sensor of the related art, electric connection between the readout circuitry and the photodiode may not be ensured, and a short may occur in the metal line electrically connected to the photodiode.

In contrast, according to the present invention, an epitaxial wafer can be used as the first substrate 100 serving as the donor wafer, and the photodetector 120 can be formed in the epitaxial wafer together with the readout circuit 130. Accordingly, since a bonding process between a substrate having the photodetector 120 and a substrate having a circuit is not required in a 3D image sensor in which the photodetector 120 is formed over the circuit, the manufacturing process can be easily performed, and problems related to bonding and contact may not occur.

If hydrogen ions or helium ions were implanted right before the bonding process, electrons generated from the photodetector may be transferred to an electronic circuit section so that the voltage is changed.

However, according to embodiments, the photodetector 120 can be formed on the first substrate 100, which is a wafer, together with the readout circuit 130. Therefore, a back end of line (BEOL) process can be used to form the metal line 140 and the interlayer dielectric layer 160.

In embodiments of the present invention, the ion implantation process using hydrogen ions or helium ions may not be performed right before the bonding process, but the ion implantation process can be performed using hydrogen ions or helium ions before the metal line 140 and the interlayer dielectric layer 160 have been formed on the epitaxial wafer serving as the first substrate 100, thereby forming the ion implantation layer 105.

Figure 6:
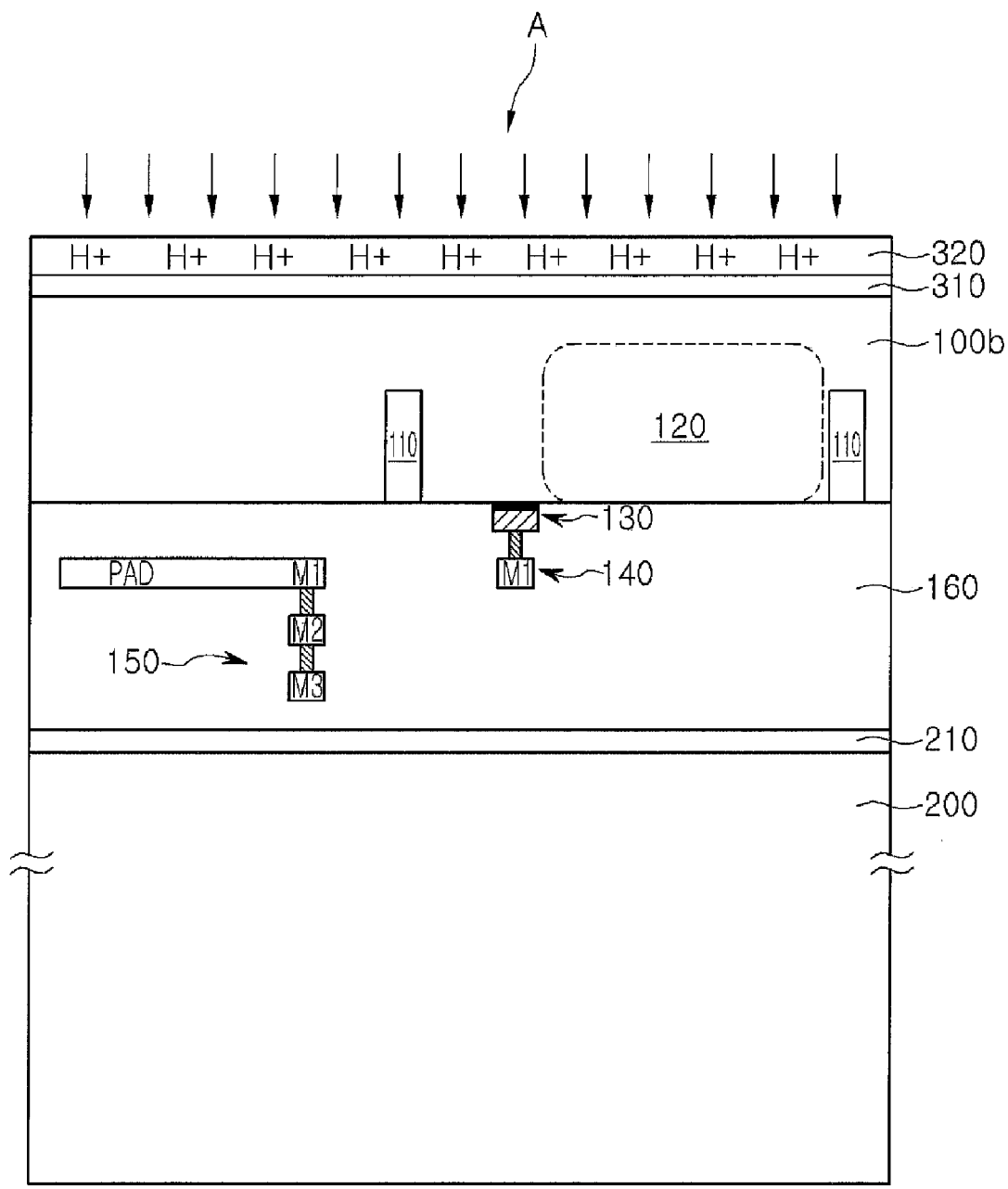

Referring to FIG. 6, an annealing process A can be performed with respect to the back side of the first substrate 100. For example, the annealing process A can include a hydrogen-annealing process, though embodiments are not limited thereto.

In an embodiment, an oxide layer 310 can be formed on the back side of the first substrate 100 before performing the annealing process A. That is, a thin oxide layer serving as a buffer layer can be formed because adhesion strength between a nitride layer 320 formed in a subsequent process and the first substrate 100 may be weak due to difference in crystalline structure between the nitride layer 320 and the first substrate 100. The oxide layer 310 can be, for example, a silicon oxide layer formed through a chemical vapor deposition (CVD) or a thermal oxidation process, though embodiments are not limited thereto.

Then, the nitride layer 320 can be formed on the oxide layer 310. In an embodiment, the nitride layer 320 can include a SiN layer having many hydrogen ions, though embodiments are not limited thereto.

In an embodiment, a sintering process can be performed with respect to the back side of the first substrate 100. Hydrogen ions H+ can be combined with a defect such as a dangle bond, and subject to a curing process. Therefore, the defects existing on the back side of the first substrate can be removed, so that a leakage characteristic can be improved.

For example, the sintering process can be performed by annealing the back side of the first substrate at pressure of about 1 Torr to about 10 Torr and temperature of about 250° C. to about 450° C. The sintering process may be performed within one hour, but the embodiment is not limited thereto.

Figure 7:
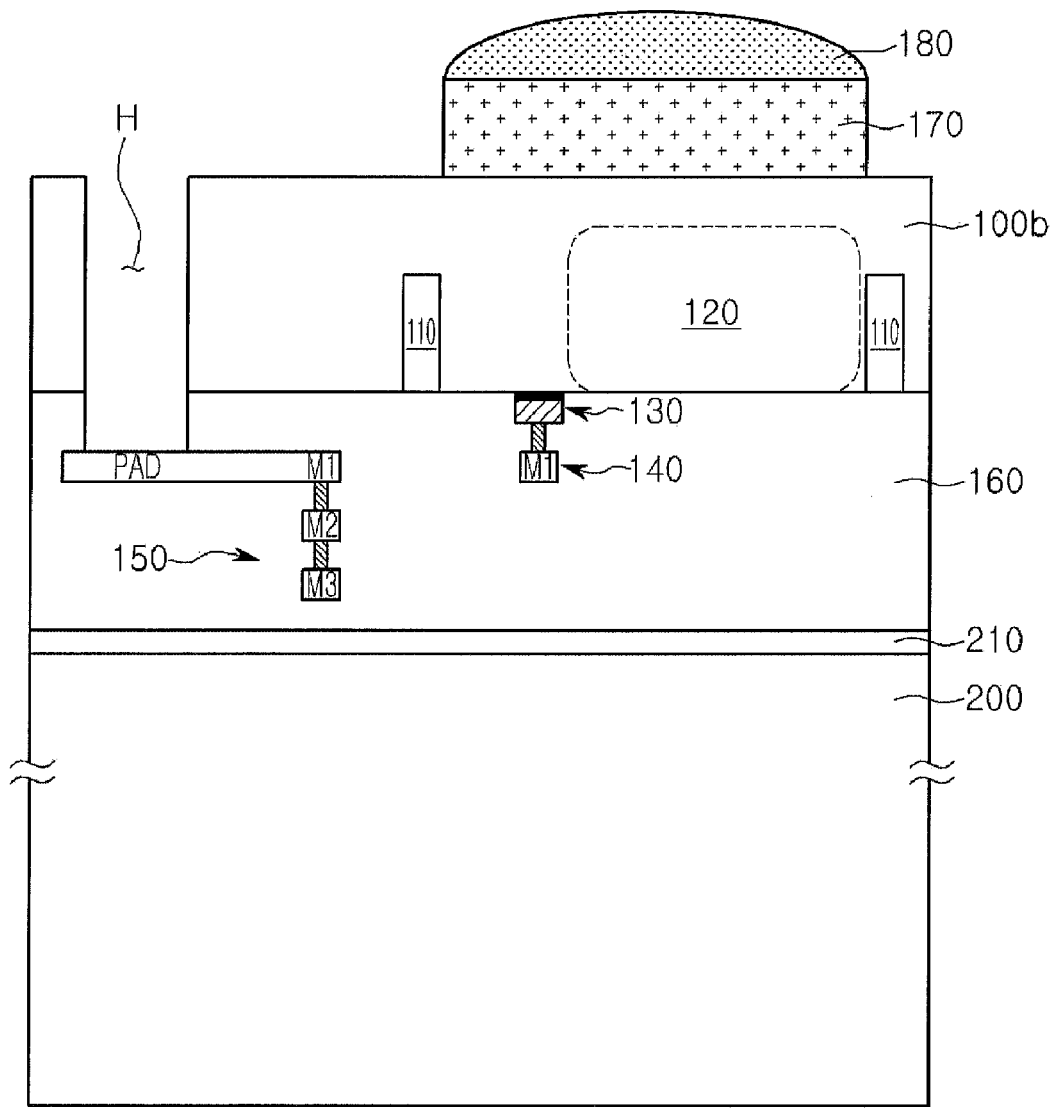

Referring to FIG. 7, the oxide layer 310 and the nitride layer 320 can be removed. Then, a color filter 170 can be formed on the photodetector 120 of the back side of the first substrate 100. In certain embodiments, (e.g., if the photodetector 120 includes R G B photodiodes which are vertically stacked), the color filter 170 may be omitted.

Thereafter, a microlens 180 can be formed on the color filter 170 or on the back side of the first substrate 100 over the photodetector 120 if the color filter 170 is omitted.

Then, in an embodiment, a PAD open process can be performed. The PAD open process can be performed with respect to the back side of the first substrate 100. Since the PAD can be aligned with the first metal M1, the PAD can be easily opened through the back side of the first substrate 100.

According to the method of manufacturing the back side illumination image sensor of the present invention, the back side of the substrate can be stably and efficiently removed through the ion implantation technology. That is, since ion implantation and cleaving schemes can be performed without performing back grinding and etch back processes, edge die fail and plasma damage may not occur.

In addition, after the back side of the substrate has been removed, an annealing process can be performed. Accordingly, defects on the substrate that may occur when the image sensor is manufactured can be inhibited, so that image quality can be improved.

Furthermore, the donor wafer may not be subjected to the grinding process, so the photodetector and the circuit section can be inhibited from being damaged.

Moreover, an epitaxial wafer can be used as the donor wafer, and the photodetector can be formed on the epitaxial wafer together with the circuit section. Thus, since the epitaxial wafer can be used instead of an SOI wafer, the manufacturing cost can be significantly reduced.

The epitaxial wafer can be used as the donor wafer, and the photodetector is formed on the epitaxial wafer together with the circuit section, so that the bonding process may not be required in the 3D image sensor where the photodetector is formed over the circuit. Accordingly, the manufacturing process can be simplified and the problems related to the bonding and contact may not occur. Also, an insulating layer, such as an interlayer dielectric layer, can be interposed between the handle wafer and the donor wafer when the handle wafer is bonded to the donor wafer, thereby improving the bonding process.

In addition, the amount of incident light can be maximized by minimizing (or at least significantly decreasing) a stack height on a light receiving section, and light interference and light reflection caused by metal routing can be inhibited, thereby significantly improving the optical characteristics of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a back side illumination image sensor, comprising:
    forming an ion implantation layer in a front side of a first substrate;
    forming an isolation area on the front side of the first substrate to define a pixel area;
    forming a photodetector and a readout circuit in the pixel area;
    forming an interlayer dielectric layer and a metal line on the front side of the first substrate;
    bonding a second substrate with the front side of the first substrate having the metal line;
    removing a lower portion of the first substrate on a basis of the ion implantation layer;
    performing an annealing process on a back side of the first substrate, wherein the back side of the first substrate is opposite the front side of the first substrate; and
    forming a microlens over the photodetector of the back side of the first substrate.

2. The method according to claim 1, wherein performing the annealing process on the back side of the first substrate comprises performing a hydrogen annealing process on the back side of the first substrate.

3. The method according to claim 1, wherein performing the annealing process on the back side of the first substrate comprises:
    forming an oxide layer on the back side of the first substrate;
    forming an SiN layer on the oxide layer; and
    performing a sintering process on the back side of the first substrate.

4. The method according to claim 1, forming the ion implantation layer comprises implanting hydrogen ions or helium ions in the front side of the first substrate.

5. The method according to claim 1, wherein the ion implantation layer is formed at a whole area of the front side of the first substrate at a uniform depth within the first substrate by performing an ion implantation process with respect to the front side of the first substrate.

6. The method according to claim 1, wherein removing a lower portion of the first substrate comprises removing performing a heat treatment with respect to the ion implantation layer.

7. The method according to claim 1, further comprising forming a color filter on the back side of the first substrate, after the lower portion of the first substrate has been removed.

8. The method according to claim 1, further comprising performing a pad opening process after the lower portion of the first substrate has been removed.

9. The method according to claim 8, wherein the pad opening process comprises opening a pad through the back side of the first substrate.

10. The method according to claim 1, further comprising forming an insulating layer on the second substrate before bonding the second substrate with the front side of the first substrate, wherein the insulating layer makes physical contact with the front side of the first substrate when the second substrate is bonded with the front side of the first substrate.

11. The method according to claim 1, wherein the isolation layer is formed before forming the ion implantation layer.

12. A method of manufacturing a back side illumination image sensor, comprising:
    forming an ion implantation layer in a front side of a first substrate;
    forming a photodetector and a readout circuit on the front side of the first substrate;

forming an interlayer dielectric layer and a metal line on the front side of the first substrate;

bonding a second substrate to the front side of the first substrate;

removing a lower portion of the first substrate on a basis of the ion implantation layer;

performing an annealing process with respect to a back side of the first substrate, wherein the back side of the first substrate is opposite the front side of the first substrate; and forming a microlens over the photodetector on the back side of the first substrate.

13. The method according to claim 12, wherein performing the annealing process on the back side of the first substrate comprises:

forming an oxide layer on the back side of the first substrate;

forming an SiN layer on the oxide layer; and performing a sintering process on the back side of the first substrate.

14. The method according to claim 13, wherein the ion implantation layer is formed at a whole area of the front side of the first substrate at a uniform depth within the first substrate by performing an ion implantation process with respect to the front side of the first substrate.

15. The method according to claim 13, further comprising performing a pad opening process after the lower portion of the first substrate has been removed.

16. The method according to claim 15, wherein the pad opening process comprises opening a pad through the back side of the first substrate.

17. The method according to claim 13, further comprising forming an insulating layer on the second substrate before bonding the second substrate with the front side of the first substrate, wherein the insulating layer makes physical contact with the front side of the first substrate when the second substrate is bonded with the front side of the first substrate.

18. The method according to claim 13, wherein the photodetector is formed before forming the ion implantation layer.

* * * * *